(12) United States Patent
Shoji et al.

(10) Patent No.: US 10,615,101 B2
(45) Date of Patent: Apr. 7, 2020

(54) ELECTRONIC DEVICE

(71) Applicant: ROHM CO., LTD., Kyoto (JP)

(72) Inventors: Yasunobu Shoji, Kyoto (JP);
Tomoichiro Toyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 76 days.

(21) Appl. No.: 15/856,181

(22) Filed: Dec. 28, 2017

(65) Prior Publication Data
US 2018/0269136 A1   Sep. 20, 2018

(30) Foreign Application Priority Data

Mar. 15, 2017  (JP) .................................. 2017-049556

(51) Int. Cl.
| | |
|---|---|
| *H01L 23/495* | (2006.01) |
| *H01L 21/48* | (2006.01) |
| *H01L 23/13* | (2006.01) |
| *H01L 23/498* | (2006.01) |
| *H01L 33/62* | (2010.01) |
| *H01L 23/00* | (2006.01) |

(52) U.S. Cl.
CPC .... *H01L 23/49513* (2013.01); *H01L 21/4825* (2013.01); *H01L 23/13* (2013.01); *H01L 23/4952* (2013.01); *H01L 23/49805* (2013.01); *H01L 24/32* (2013.01); *H01L 24/48* (2013.01); *H01L 24/73* (2013.01); *H01L 33/62* (2013.01); *H01L 2224/26175* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/48465* (2013.01); *H01L 2224/73265* (2013.01); *H01L 2224/97* (2013.01); *H01L 2924/00014* (2013.01); *H01L 2924/12035* (2013.01); *H01L 2924/12041* (2013.01); *H01L 2924/14* (2013.01); *H01L 2924/181* (2013.01); *H01L 2924/19041* (2013.01); *H01L 2924/19043* (2013.01); *H01L 2924/35121* (2013.01); *H01L 2933/0066* (2013.01)

(58) Field of Classification Search
CPC ...................... H01L 23/49513; H01L 23/4952
See application file for complete search history.

(56) References Cited

U.S. PATENT DOCUMENTS

2013/0043504 A1*  2/2013 Kobayakawa .......... H01L 33/62
257/99

FOREIGN PATENT DOCUMENTS

JP        2015-115432       6/2015

* cited by examiner

*Primary Examiner* — Douglas M Menz
(74) *Attorney, Agent, or Firm* — Hamre, Schumann, Mueller & Larson, P.C.

(57) ABSTRACT

An electronic device includes: a base; a wiring pattern formed on the base; an electronic element disposed on the wiring pattern; and a bonding layer interposed between the electronic element and the wiring pattern, wherein an opening is formed in the wiring pattern and the bonding layer is in contact with a portion of the base exposed by the opening in the wiring pattern.

25 Claims, 15 Drawing Sheets

ELECTRONIC DEVICE

CROSS-REFERENCE TO RELATED APPLICATION

This application is based upon and claims the benefit of priority from Japanese Patent Application No. 2017-49556, filed on Mar. 15, 2017, the entire contents of which are incorporated herein by reference.

TECHNICAL FIELD

The present disclosure relates to an electronic device.

BACKGROUND

A conventional semiconductor light emitting device includes a base, a semiconductor light emitting element, a wiring pattern, a bonding layer, and a sealing resin. The wiring pattern is formed on the base. The semiconductor light emitting element is disposed on the wiring pattern via the bonding layer. The sealing resin is disposed on the base so as to cover the semiconductor light emitting element and the wiring pattern.

SUMMARY

Some embodiments of the present disclosure provide an electronic device capable of preventing a bonding layer from peeling from a wiring pattern or a base.

According to one embodiment of the present disclosure, there is provided an electronic device including: a base; a wiring pattern formed on the base; an electronic element disposed on the wiring pattern; and a bonding layer interposed between the electronic element and the wiring pattern, wherein an opening is formed in the wiring pattern and the bonding layer is in contact with a portion of the base exposed by the opening in the wiring pattern.

Other features and advantages of the present disclosure will become more apparent from the following detailed description in conjunction with the accompanying drawings.

DETAILED DESCRIPTION

Embodiments of the present disclosure will be now described in detail with reference to the drawings.

First Embodiment

A first embodiment will be described below with reference to FIGS. 1 to 13.

Figure 1:
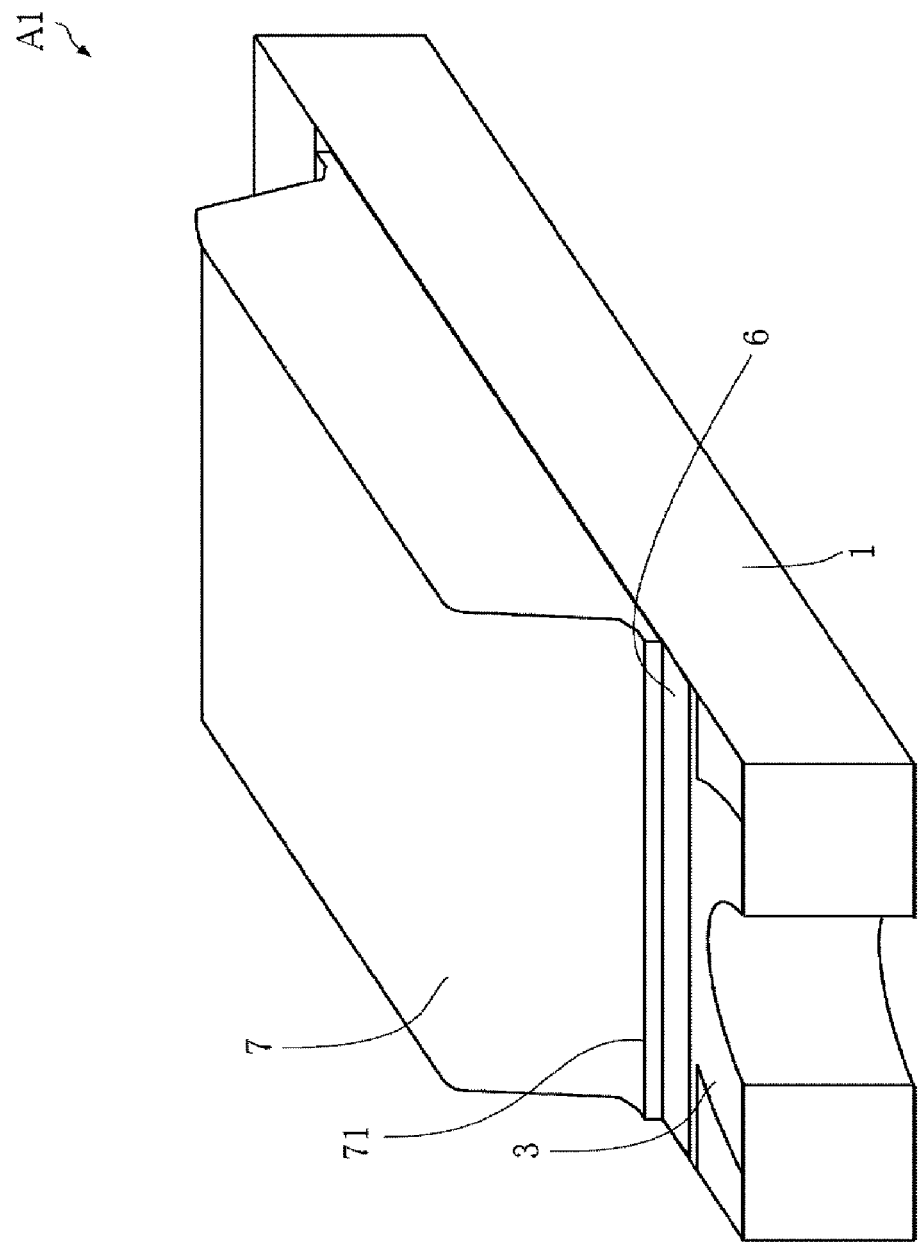
FIG. 1 is a perspective view of an electronic device according to a first embodiment.
Figure 2:
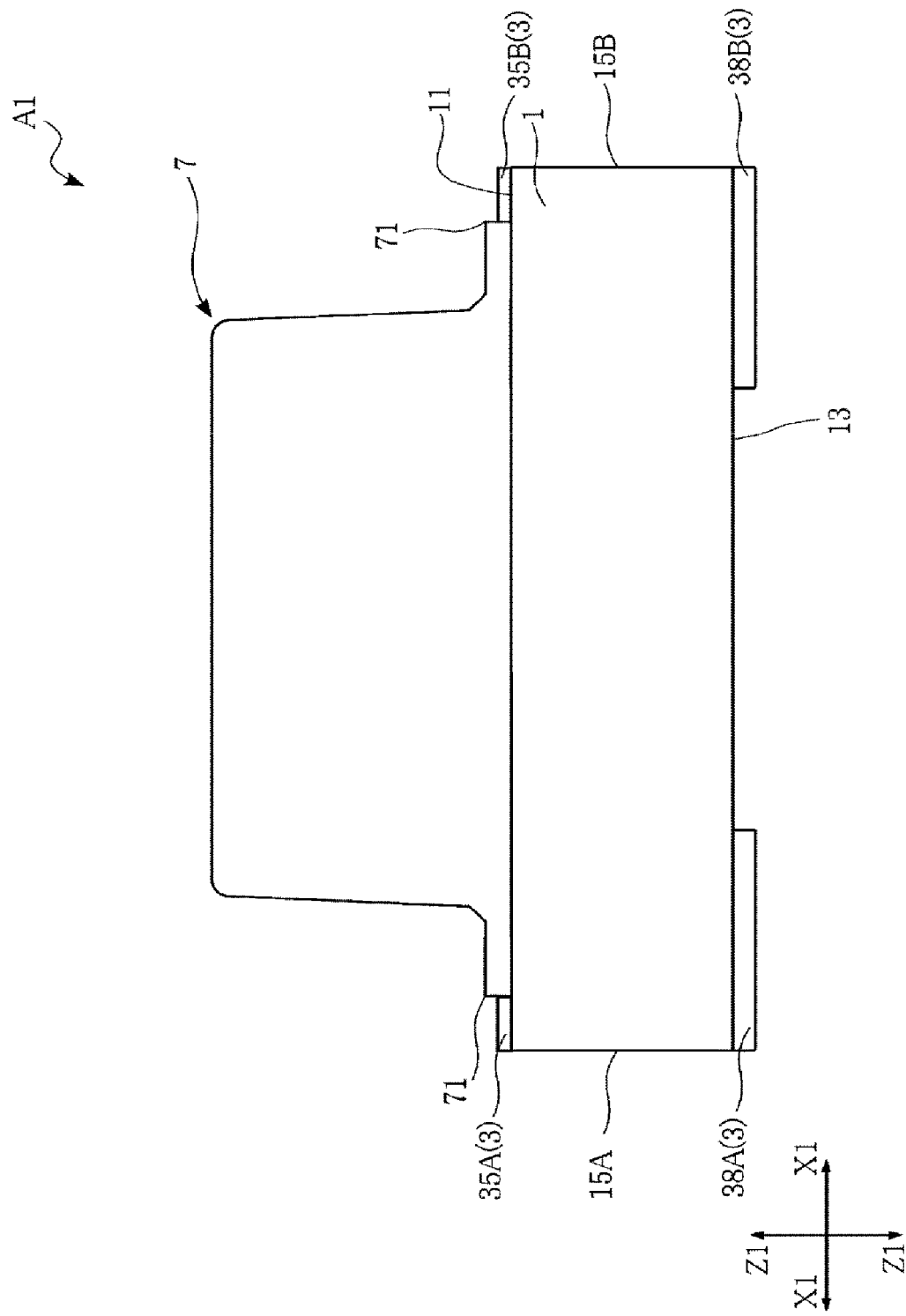
FIG. 2 is a front view of the electronic device according to the first embodiment.
Figure 3:
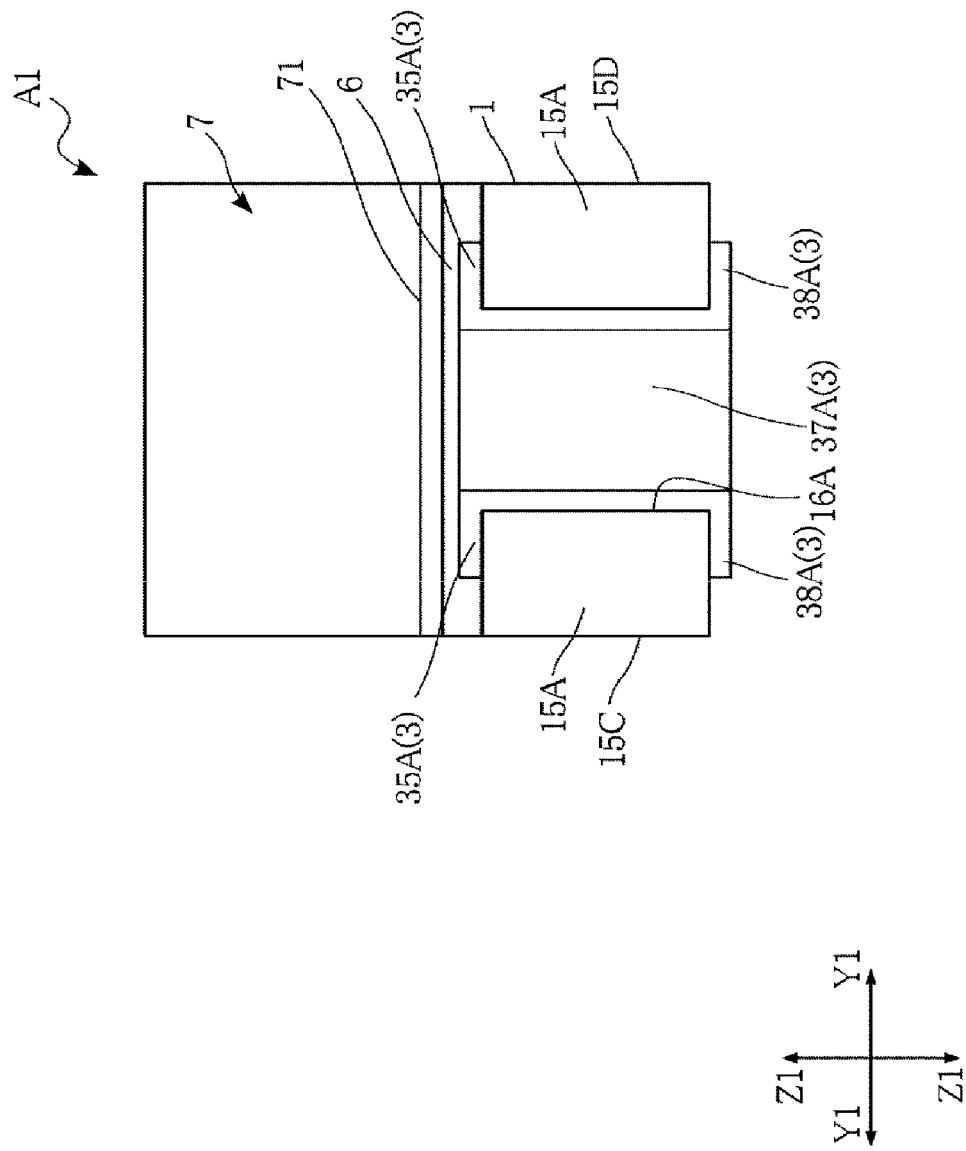
FIG. 3 is a left side view of the electronic device according to the first embodiment.
Figure 4:
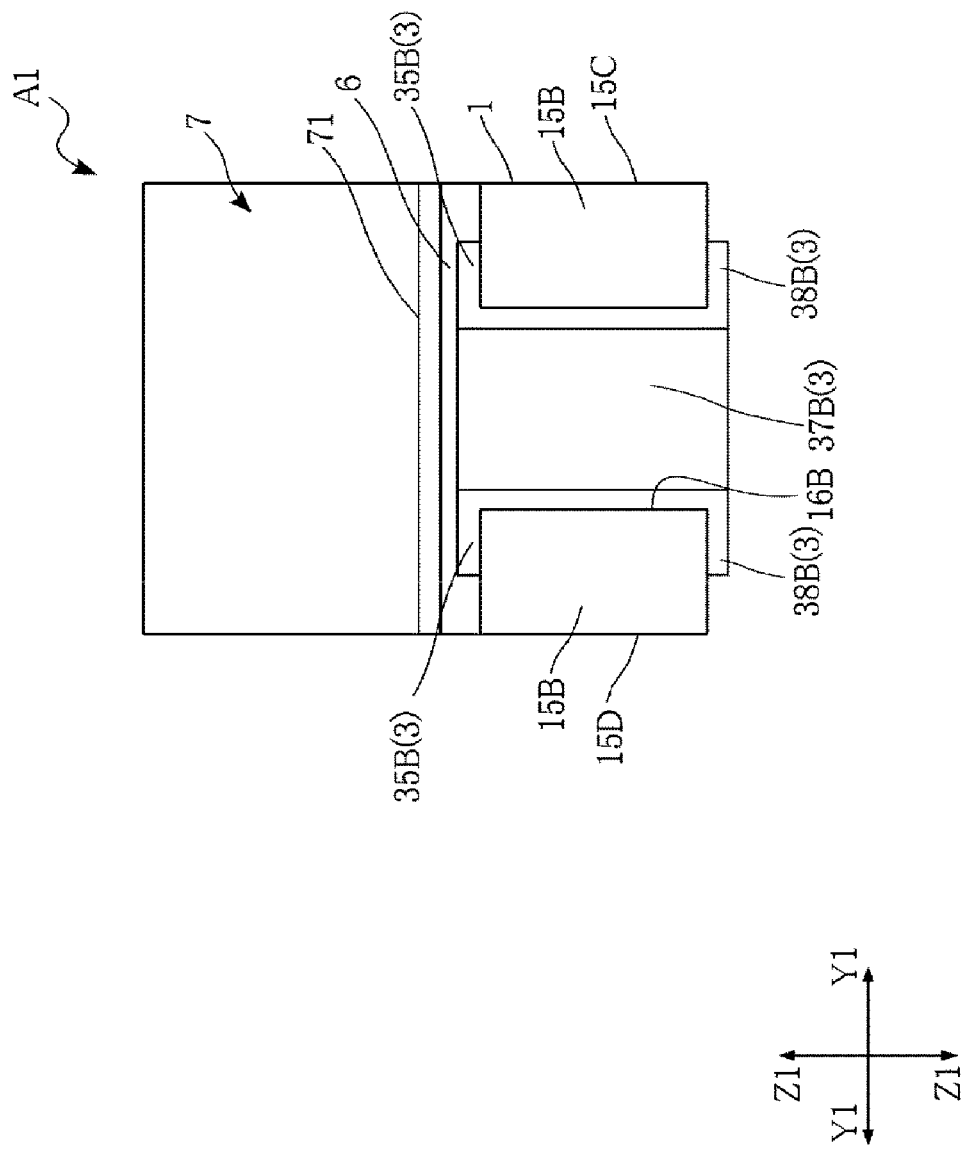
FIG. 4 is a right side view of the electronic device according to the first embodiment.
Figure 5:
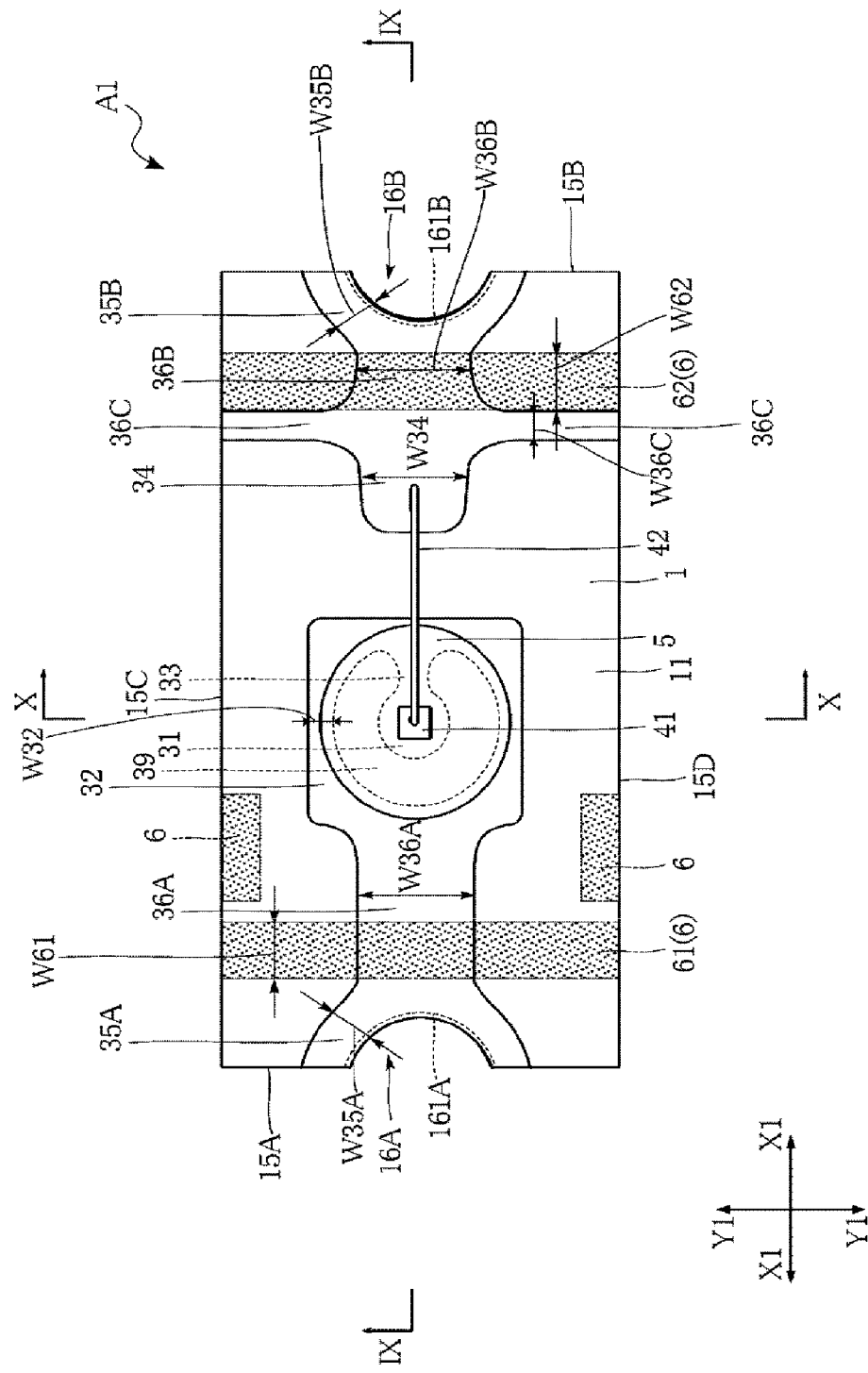
FIG. 5 is a plan view of the electronic device according to the first embodiment.

FIG. 1 is a perspective view of an electronic device according to a first embodiment. FIG. 2 is a front view of the electronic device according to the first embodiment. FIG. 3 is a left side view of the electronic device according to the first embodiment. FIG. 4 is a right side view of the electronic device according to the first embodiment. FIG. 5 is a plan view of the electronic device according to the first embodiment.

An electronic device A1 shown in these figures includes a base 1, a wiring pattern 3, an electronic element 41, a wire 42, a bonding layer 5, a protective layer 6, and a resin portion 7. The resin portion 7 is not shown in FIG. 5.

The base 1 is made of, e.g., insulating material such as insulating resin or ceramic. An example of the insulating resin may include glass epoxy resin or the like. An example of the ceramic may include $Al_2O_3$, SiC, AlN, or the like. The base 1 may be a substrate on which an insulating film made of metal such as aluminum is formed. The base 1 has a rectangular shape when viewed in a thickness direction Z1 of the base 1.

The base 1 has a main surface 11, a back surface 13, a first side surface 15A, a second side surface 15B, a third side surface 15C, and a fourth side surface 15D.

The main surface 11 and the back surface 13 are separated from each other in the thickness direction Z1 of the base 1 and face opposite directions. Both the main surface 11 and the back surface 13 are flat.

The first side surface 15A and the second side surface 15B are separated from each other in a first direction X1 and face opposite directions. Both the first side surface 15A and the second side surface 15B are connected to the main surface 11 and the back surface 13. Both the first side surface 15A and the second side surface 15B are flat.

A first concave portion 16A and a second concave portion 16B are formed in the base 1. The first concave portion 16A and the second concave portion 16B are recessed inwardly from the first side surface 15A and the second side surface 15B of the base 1, respectively. Both the first concave portion 16A and the second concave portion 16B are formed to span from the main surface 11 to the back surface 13. In the first embodiment, the first concave portion 16A and the second concave portion 16B have a semicircular shape when viewed in the thickness direction Z1 of the base 1.

The third side surface 15C and the fourth side surface 15D are separated from each other in a second direction Y1 and face opposite directions. Both the third side surface 15C and the fourth side surface 15D are connected to the main surface 11 and the back surface 13. Both the third side surface 15C and the fourth side surface 15D are flat.

Figure 6:
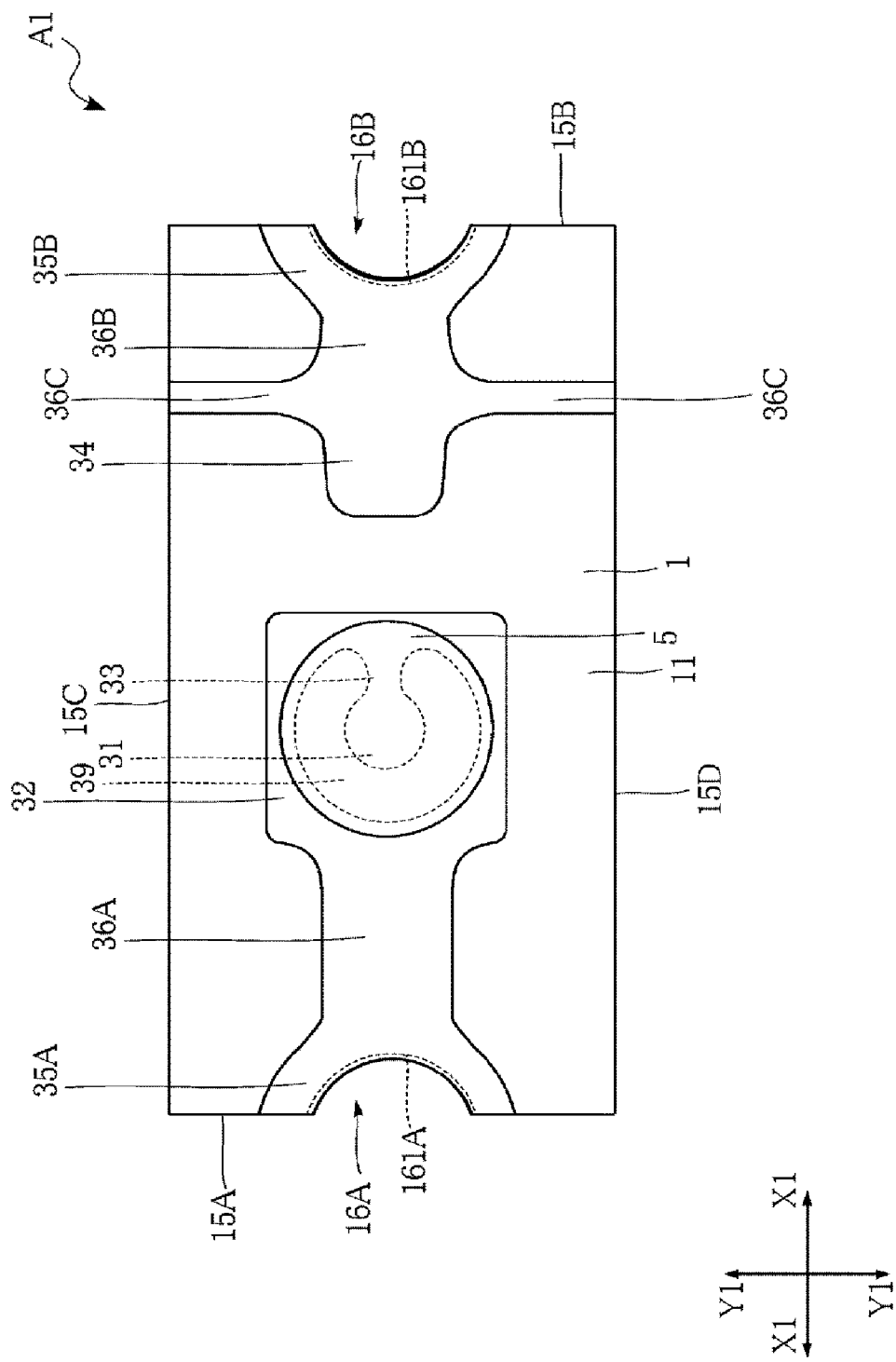
FIG. 6 is a view in which an electronic element, a wire, and a protective layer are excluded from the electronic device shown in FIG. 5.
Figure 7:
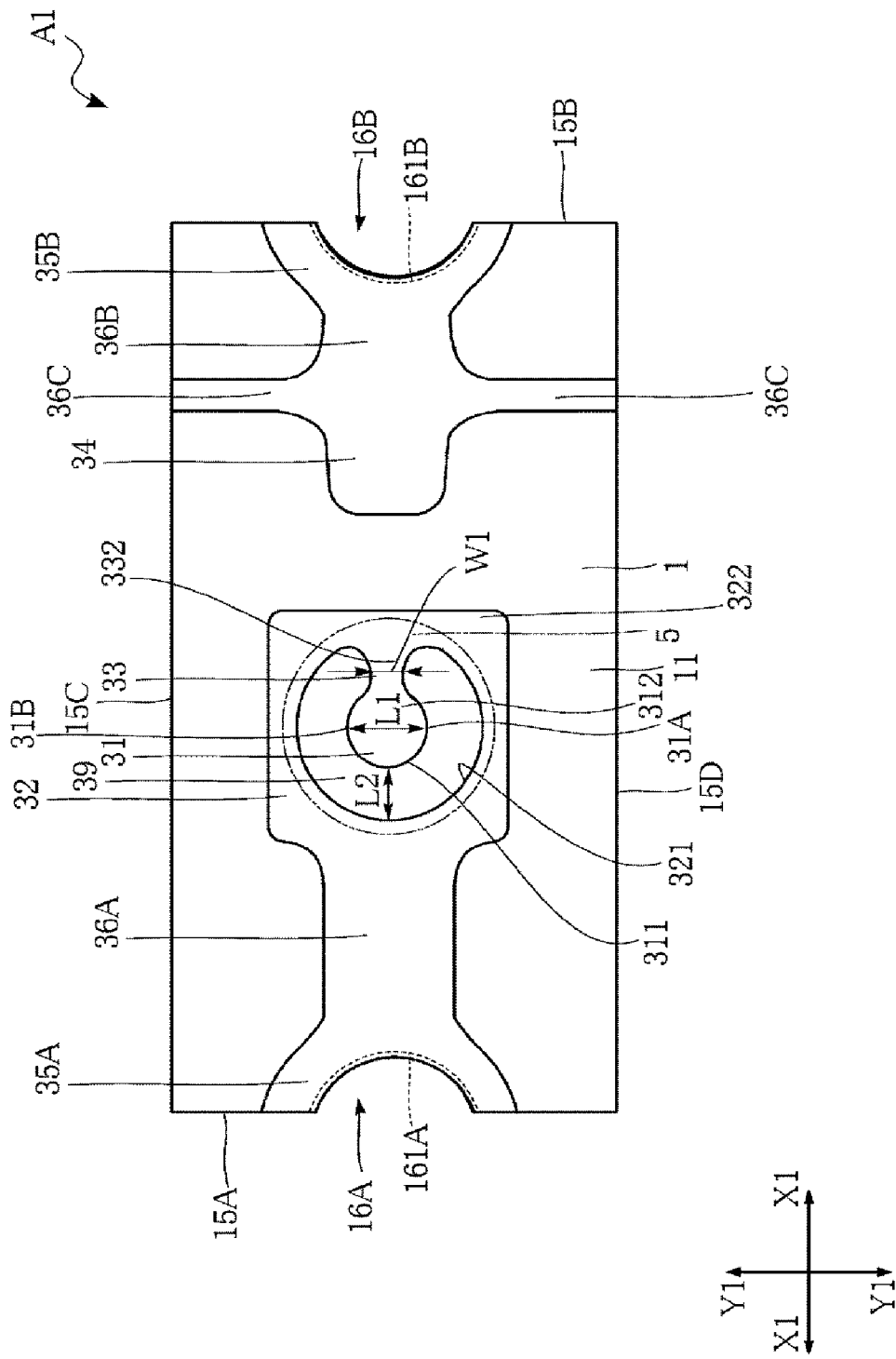
FIG. 7 is a view in which a bonding layer is excluded from the electronic device shown in FIG. 6.
Figure 8:
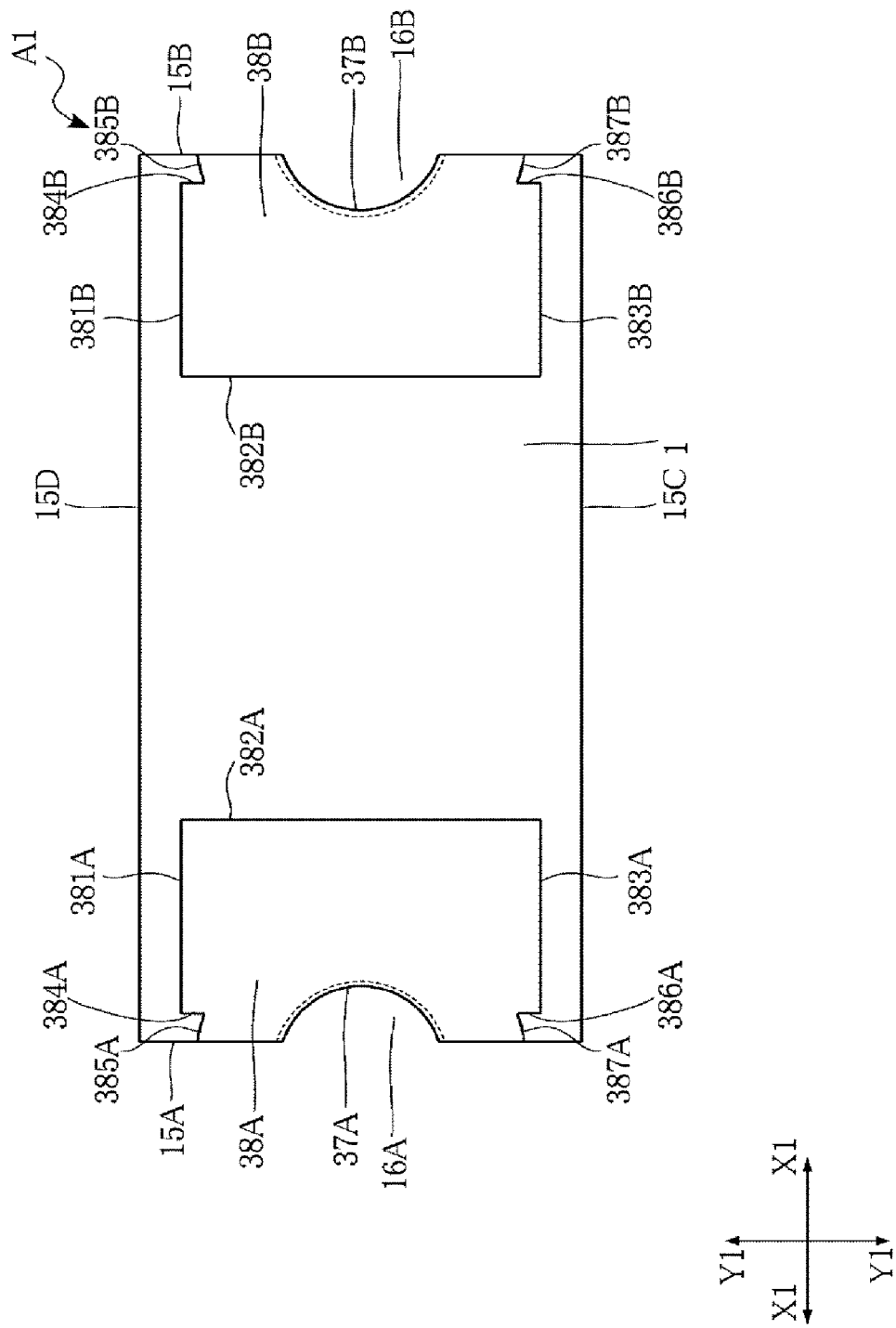
FIG. 8 is a bottom view of the electronic device according to the first embodiment.

FIG. 6 is a view in which an electronic element, a wire, and a protective layer are excluded from the electronic device shown in FIG. 5. FIG. 7 is a view in which a bonding layer is excluded from the electronic device shown in FIG. 6. FIG. 8 is a bottom view of the electronic device according to the first embodiment.

The wiring pattern 3 shown in FIG. 5 to FIG. 7 defines a current path through which electric power is supplied to the electronic element 41. The wiring pattern 3 is electrically connected to the electronic element 41. The wiring pattern 3 is made of, e.g., metal such as Cu, Ni, Ti, Au, or the like alone or in combination. The wiring pattern 3 is formed on the base 1. In the first embodiment, the wiring pattern 3 is formed by plating Au on Cu. The material of the wiring pattern 3 is not particularly limited to those mentioned here. The wiring pattern 3 is formed on the main surface 11 and the back surface 13. In the first embodiment, the wiring pattern 3 is formed in the first concave portion 16A and the second concave portion 16B.

The wiring pattern 3 includes a die pad portion 31, a first conductive portion 32, a second conductive portion 33, a first edge portion 35A, a second edge portion 35B, a first connecting portion 36A, a second connecting portion 36B, a first side surface portion 37A, a second side surface portion 37B, a first back surface portion 38A, and a second back surface portion 38B. An opening 39 is formed in the wiring pattern 3.

Figure 9:
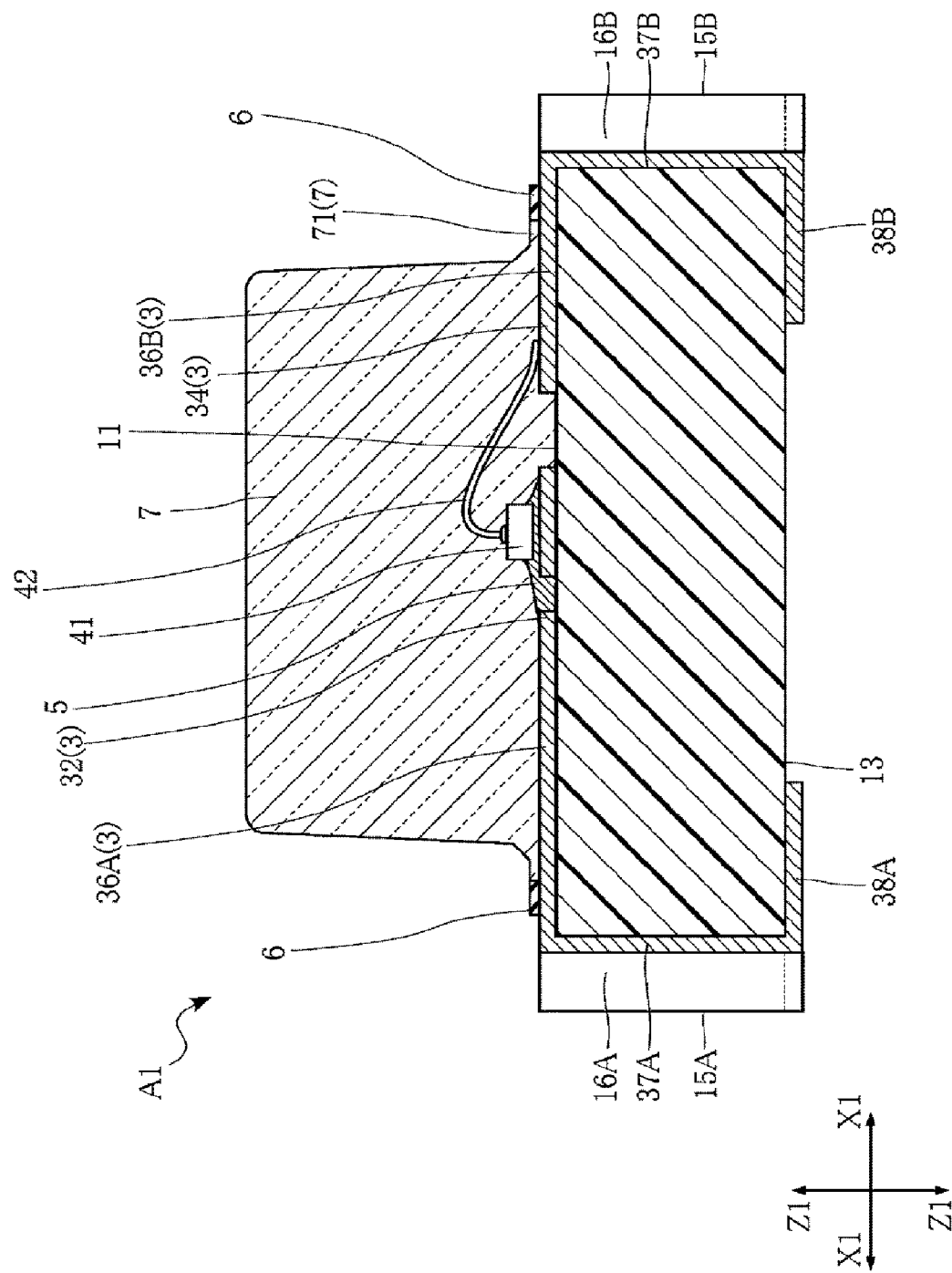
FIG. 9 is a cross-sectional view taken along line IX-IX in FIG. 5.
Figure 10:
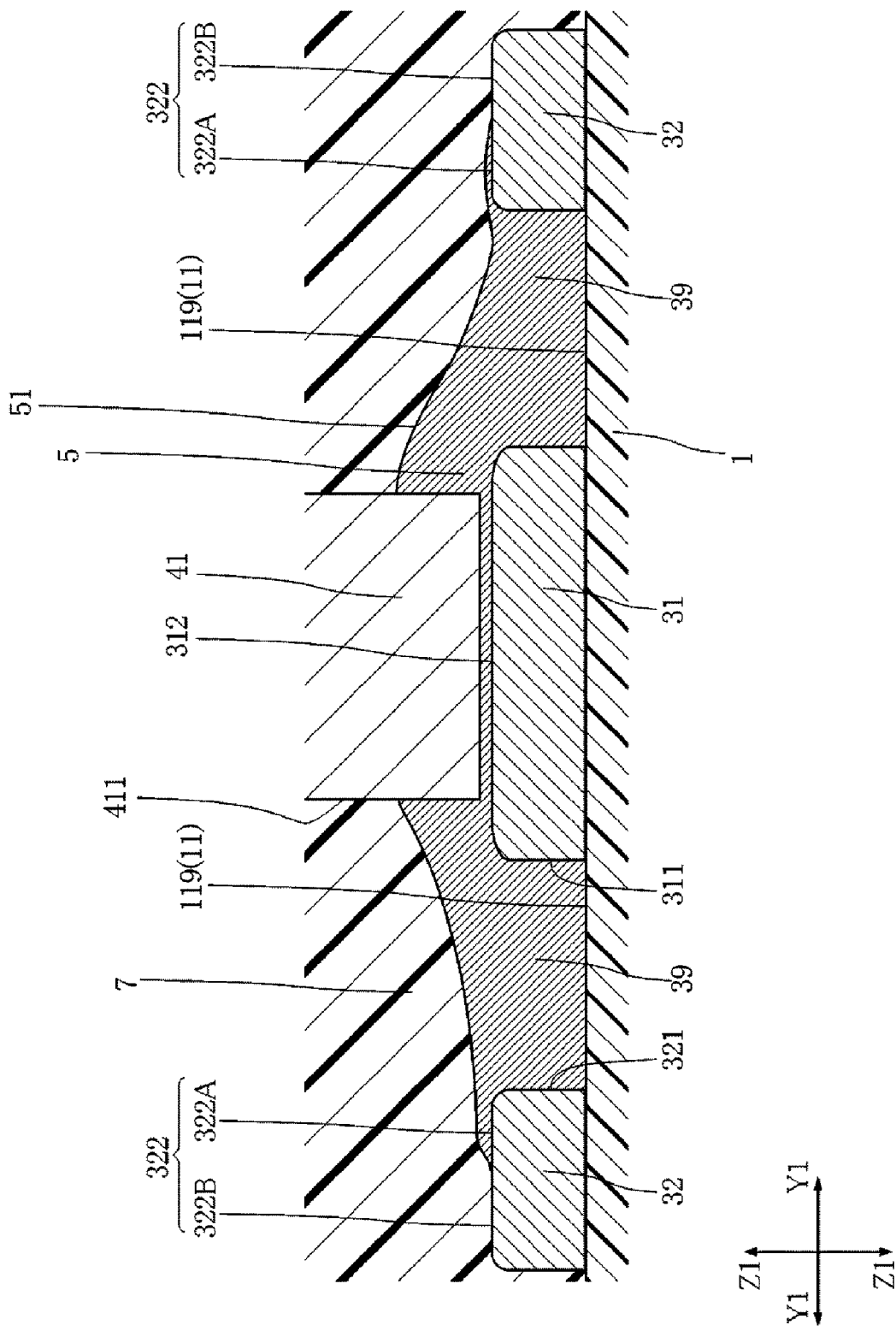
FIG. 10 is a cross-sectional view taken along line X-X in FIG. 5.

FIG. 9 is a cross-sectional view taken along line IX-IX in FIG. 5. FIG. 10 is a cross-sectional view taken along line X-X in FIG. 5.

In the first embodiment, the opening 39 has an annular shape (more specifically, an annular shape with a portion missed). The bonding layer 5 is disposed in the opening 39. As shown in FIG. 10, the bonding layer 5 is in contact with a portion 119 of the base 1 exposed by the opening 39 in the wiring pattern 3.

As shown in FIGS. 5 to 7 and FIGS. 9 and 10, the die pad portion 31, the first conductive portion 32, the second conductive portion 33, the first edge portion 35A, the second edge portion 35B, the first connecting portion 36A, and the second connecting portion 36B are formed on the main surface 11 of the base 1.

The electronic element 41 is disposed on the die pad portion 31. A part of the die pad portion 31 defines the opening 39. The bonding layer 5 is in contact with the die pad portion 31. The die pad portion 31 includes a first inner side surface 311 facing a direction intersecting the thickness direction Z1 of the base 1 (a direction perpendicular to the thickness direction Z1 in the first embodiment). The first inner side surface 311 defines a part of the opening 39. In the first embodiment, the bonding layer 5 is in contact with the first inner side surface 311. As shown in FIG. 7, the die pad portion 31 includes a first edge 31A and a second edge 31B located opposite to each other in the die pad portion 31 when viewed in the thickness direction Z1 of the base 1.

The first conductive portion 32 is separated from the die pad portion 31. In the first embodiment, the first conductive portion 32 is annular and surrounds the die pad portion 31. More specifically, the first conductive portion 32 is in an annular form having a rectangular outer shape. The outer shape of the first conductive portion 32 is not limited to the rectangular shape but may be other shapes such as a circular shape and a triangular shape. A part of the first conductive portion 32 defines the opening 39. When viewed in the thickness direction Z1 of the base 1, the opening 39 is interposed between the first conductive portion 32 and the die pad portion 31. The bonding layer 5 is in contact with the first conductive portion 32.

As shown in FIG. 10, the first conductive portion 32 includes a second inner side surface 321 facing the first inner side surface 311. The second inner side surface 321 has an arc shape when viewed in the thickness direction Z1. The bonding layer 5 is in contact with the second inner side surface 321. Unlike the first embodiment, the second inner side surface 321 may not be in contact with the bonding layer 5 but may be separated from the bonding layer 5. The first conductive portion 32 has a front surface 322 facing the thickness direction Z1 of the base 1. The front surface 322 of the first conductive portion 32 has a contact part 322A and an exposed part 322B. The contact part 322A is in contact with the bonding layer 5. The exposed part 322B is exposed from the bonding layer 5. The contact part 322A is located between the exposed part 322B and the opening 39 when viewed in the thickness direction Z1 of the base 1. As shown in FIG. 7, in the first embodiment, a distance L2 between the second inner side surface 321 and the first inner side surface 311 is substantially equal to a distance L1. However, the distance L2 may be smaller or larger than the distance L1. In the first embodiment, the distance L2 is larger than a width W1 of the second conductive portion 33. For example, the distance L1 may be larger than the distance L2 and the distance L2 may be larger than the width W1. When the distances L1 and L2 are larger than the width W1, this means that the width of a portion (the second conductive portion 33) connecting the die pad portion 31 is small, thereby limiting the possibility of the die pad portion 31 from peeling. Since the distance L2 is smaller than the distance L1, a force of lifting the electronic element 41 at the time of application of a thermal stress or the like becomes small, reducing the likelihood of the electronic element 41 from slipping out.

As shown in FIG. 7, the second conductive portion 33 is connected to both the die pad portion 31 and the first conductive portion 32. The second conductive portion 33 is located between the die pad portion 31 and the first conductive portion 32. A part of the second conductive portion 33 defines the opening 39. The bonding layer 5 is in contact with the second conductive portion 33. The second conductive portion 33 extends from the die pad portion 31 toward the first conductive portion 32 when viewed in the thickness direction Z1 of the base 1. Specifically, the second conductive portion 33 is disposed on a side opposite the first edge portion 35A with respect to the die pad portion 31. The second conductive portion 33 has a front surface 332 facing the thickness direction Z1 of the base 1. The front surface 332 of the second conductive portion 33 is in contact with the bonding layer 5. In the first embodiment, the entire front surface 332 is in contact with the bonding layer 5. In the first embodiment, the width W1 of the second conductive portion 33 is smaller than the separation distance L1 between the first edge 31A and the second edge 31B. Unlike the first embodiment, the width W1 of the second conductive portion 33 may be equal to or greater than the separation distance L1 between the first edge 31A and the second edge 31B.

Unlike the first embodiment, the second conductive portion 33 may not be formed. The die pad portion 31 may be insulated from any other portion of the wiring pattern 3. In this case, the opening 39 may have a completely annular shape rather than the partial annular shape.

As shown in FIG. 7, the first edge portion 35A extends along an edge 161A of the first concave portion 16A. In the first embodiment, the first edge portion 35A is semi-annular. The first connecting portion 36A is located between the first conductive portion 32 and the first edge portion 35A and is electrically connected to the first conductive portion 32 and the first edge portion 35A. More specifically, the first connecting portion 36A is connected to the first conductive portion 32 and the first edge portion 35A.

The wire 42 is bonded to a wire bonding pad portion 34. The wire bonding pad portion 34 is separated from the die pad portion 31 in the first direction X1.

The second edge portion 35B extends along an edge 161B of the second concave portion 16B. In the first embodiment, the second edge portion 35B is semi-annular. The second connecting portion 36B is located between the wire bonding pad portion 34 and the second edge portion 35B and is electrically connected to the wire bonding pad portion 34 and the second edge portion 35B. More specifically, the second connecting portion 36B is connected to the wire bonding pad portion 34 and the second edge portion 35B.

In the first embodiment, the wiring pattern 3 includes a conductive portion 36C. The conductive portion 36C extends along the second direction Y1 and reaches the third side surface 15C and the fourth side surface 15D. The conductive portion 36C is connected to the wire bonding pad portion 34 and the second connecting portion 36B.

The first side surface portion 37A is formed on the inner surface of the first concave portion 16A and is connected to the first edge portion 35A. The second side surface portion 37B is formed on the inner surface of the second concave portion 16B and is connected to the second edge portion 35B.

As shown in FIG. 8, the first back surface portion 38A and the second back surface portion 38B are formed on the back surface 13 of the base 1.

The first back surface portion 38A is connected to the first side surface portion 37A. The first back surface portion 38A includes edges 381A to 387A. The edge 381A extends along the first direction X1. The edge 382A extends along the second direction Y1 and is connected to the edge 381A. The edge 383A extends along the first direction X1 and is connected to the edge 382A. The edge 384A extends along the second direction Y1 and is connected to the edge 381A. The edge 384A is shorter than the edge 382A. The edge 385A is a circular-arc shape and is connected to the edge 384A. The edge 385A reaches an end of the back surface 13 of the base 1 in the first direction X1. The edge 386A extends along the second direction Y1 and is connected to the edge 383A. The edge 386A is shorter than the edge 382A. The edge 387A is a circular-arc shape and is connected to the edge 386A. The edge 387A reaches the end of the back surface 13 of the base 1 in the first direction X1.

The second back surface portion 38B is connected to the second side surface portion 37B. The second back surface portion 38B includes edges 381B to 387B. The edge 381B extends along the first direction X1. The edge 382B extends along the second direction Y1 and is connected to the edge 381B. The edge 383B extends along the first direction X1 and is connected to the edge 382B. The edge 384B extends along the second direction Y1 and is connected to the edge 381B. The edge 384B is shorter than the edge 382B. The edge 385B is a circular-arc shape and is connected to the edge 384B. The edge 385B reaches an end of the back surface 13 of the base 1 in the first direction X1. The edge 386B extends along the second direction Y1 and is connected to the edge 383B. The edge 386B is shorter than the edge 382B. The edge 387B is a circular-arc shape and is connected to the edge 386B. The edge 387B reaches the end of the back surface 13 of the base 1 in the first direction X1.

The electronic element 41 is disposed on the die pad portion 31 of the wiring pattern 3. In the first embodiment, the electronic element 41 is a semiconductor element, more specifically an optical element including a light emitting element and a light receiving element. In the first embodiment, the electronic element 41 is a light emitting element and serves as a light source of the electronic device A1. In the first embodiment, the electronic element 41 is an LED chip. In the first embodiment, the electronic element 41 includes an n-type semiconductor layer, an active layer, and a p-type semiconductor layer. The n-type semiconductor layer is laminated on the active layer. The active layer is laminated on the p-type semiconductor layer. Therefore, the active layer is located between the n-type semiconductor layer and the p-type semiconductor layer. The n-type semiconductor layer, the active layer, and the p-type semiconductor layer are made of, e.g., GaN. The electronic element 41 includes a main surface electrode pad (not shown) and a back surface electrode pad (not shown) facing opposite directions. The electronic element 41 is mounted on the base 1. The emission color of the electronic element 41 is not particularly limited.

Unlike the first embodiment, the electronic element 41 need not be an optical element. For example, the electronic element 41 may be an element (for example, a Zener diode or an IC chip) that does not perform an optical function. The electronic element 41 need not be a semiconductor element. For example, the electronic element 41 may be a resistor or a capacitor.

The wire 42 is bonded to the electronic element 41 and the wire bonding pad portion 34. The wire 42 is made of a conductive material. The wire 42 makes electrical conduction with the electronic element 41 and the wire bonding pad portion 34. In the first embodiment, the wire 42 extends along the first direction X1 when viewed in the thickness direction Z1.

As shown in FIG. 10, the bonding layer 5 is interposed between the electronic element 41 and the wiring pattern 3. A part of the bonding layer 5 is filled in the opening 39. In the first embodiment, the bonding layer 5 is made of a conductive material. The bonding layer 5 is derived from, e.g., silver paste. Unlike the first embodiment, the bonding layer 5 may be made of an insulating material. In the first embodiment, the bonding layer 5 is in contact with (or in close contact with) a side surface 411 of the electronic element 41, the first inner side surface 311 of the die pad portion 31, and a front surface 312 of the die pad portion 31. This allows the bonding layer 5 to hold the electronic element 41 more firmly. The height of the bonding layer 5 from the main surface 11 is greater than the height of the die pad portion 31 from the main surface 11. A front surface 51 of the bonding layer 5 is located farther from the main surface 11 than the front surface 312 of the die pad portion 31.

The protective layer 6 is made of an insulating material. The protective layer 6 may be sometimes referred to as a resist layer. The protective layer 6 is formed on the main surface 11 and the wiring pattern 3. As shown in FIGS. 3 and 4, the protective layer 6 is interposed between the base 1 and the resin portion 7 and is in contact with the base 1 and the resin portion 7.

The protective layer 6 includes portions 61 and 62. The portions 61 and 62 extend along the second direction Y1. The portions 61 and 62 extend from one end of the main surface 11 to the other end thereof in the second direction Y1. A part of the portion 61 is formed on the first connecting portion 36A. A part of the portion 62 is formed on the second connecting portion 36B.

As shown in FIG. 5, in the first embodiment, the width W32 of the narrowest part of the first conductive portion 32 is smaller than any one of the width W35A of the first edge portion 35A, the width W36A of the first connecting portion 36A, and the width W61 of the portion 61 of the protective layer 6. In the first embodiment, the width W35A of the first edge portion 35A and the width W61 of the portion 61 of the protective layer 6 are smaller than the width W36A of the first connecting portion 36A. In the first embodiment, the width W34 of the wire bonding pad portion 34 is larger than any one of the width W35B of the second edge portion 35B, the width W36C of the conductive portion 36C, and the width W62 of the portion 62 of the protective layer 6. In the first embodiment, the width W36C of the conductive portion 36C is smaller than any one of the width W35B of the second edge portion 35B, the width W36B of the second connecting portion 36B, and the width W62 of the portion 62 of the protective layer 6. In the first embodiment, the width W34 of the wire bonding pad portion 34 is smaller than the width W36A of the first connecting portion 36A.

The resin portion 7 covers the base 1, the electronic element 41, the wiring pattern 3, the protective layer 6, and the wire 42. In the first embodiment, the resin portion 7 is made of resin that transmits light, such as transparent or translucent epoxy resin, silicone resin, acrylic resin, polyvinyl resin, or the like. The resin portion 7 may include a fluorescent material which emits light of different wavelengths when excited by light from the electronic element 41. In the first embodiment, unlike a case where the resin portion is a so-called black resin, no filler is mixed in the resin portion 7. As shown in FIGS. 1 to 4 and so on, the resin portion 7 includes an edge 71. The edge 71 of the resin portion 7 extends along the second direction Y1. The edge 71 extends from one end of the electronic device A1 to the other end thereof in the second direction Y1.

The resin portion 7 is formed by molding. The resin portion 7 is smaller than the base 1 in the first direction X1. In the first embodiment, the resin portion 7 has a truncated quadrangular pyramid shape. The resin portion 7 is not limited to the truncated quadrangular pyramid shape but may have a hemispherical shape protruding in the thickness direction Z1 of the base 1 or may have a concave surface on the front side in the thickness direction Z1 of the base 1. Unlike the first embodiment, a reflector surrounding the resin portion 7 and the electronic element 41 may be disposed on the base 1.

Figure 11:
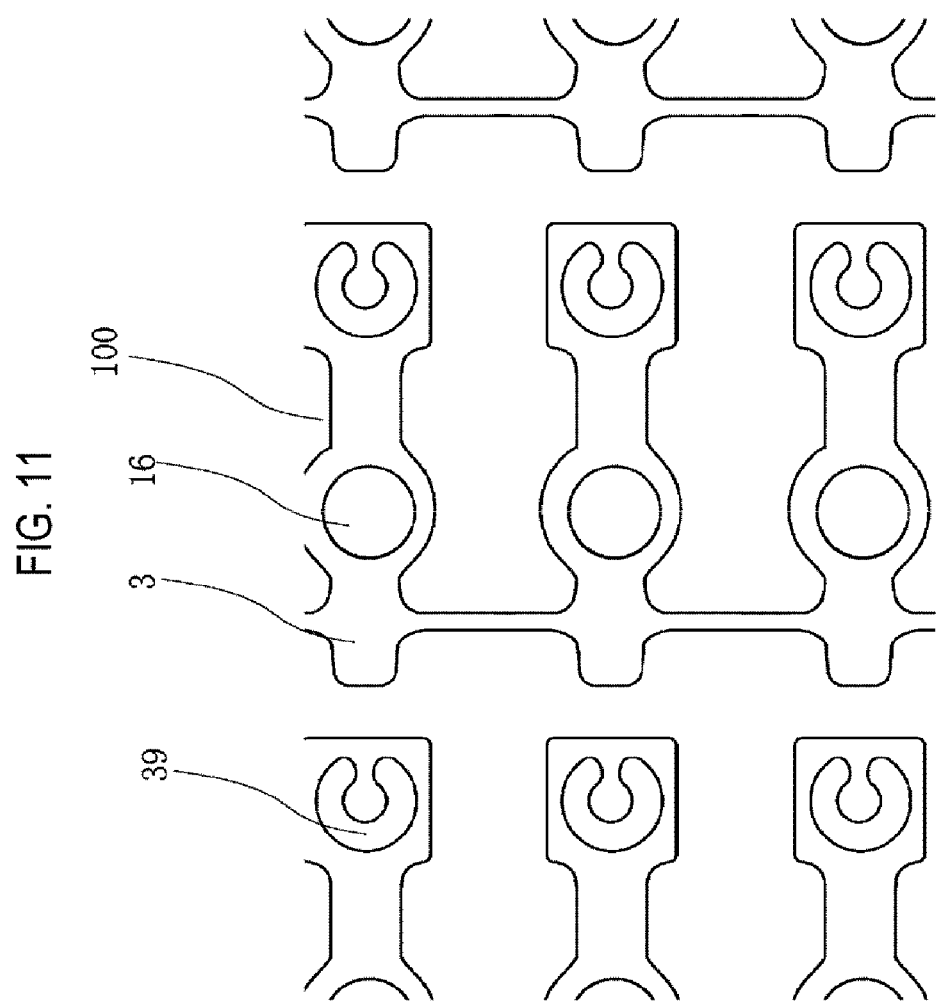
FIG. 11 is a plan view of an electronic device at a certain point of time in a method of manufacturing the electronic device according to the first embodiment.

Next, a method of manufacturing the electronic device A1 according to the first embodiment will be described with reference to FIGS. 11 to 13. In the first embodiment, a case of manufacturing a plurality of electronic devices A1 will be described as an example. In the following description, the same or similar elements, portions and parts as above are denoted by the same reference numerals.

First, a rectangular base 100 (see FIG. 11) in which a plurality of through-holes 16 are formed in a matrix is prepared. The base 100 has such a size that a plurality of bases 1 shown in FIG. 2 and so on can be formed. A plurality of circular through-holes 16 are formed in the base 100. The base 100 is made of the same material (that is to say, glass epoxy resin) as the base 1. Next, the wiring pattern 3 is formed on the base 100. The wiring pattern 3 is formed by plating Au on a Cu foil. The opening 39 is formed in the wiring pattern 3.

Figure 12:
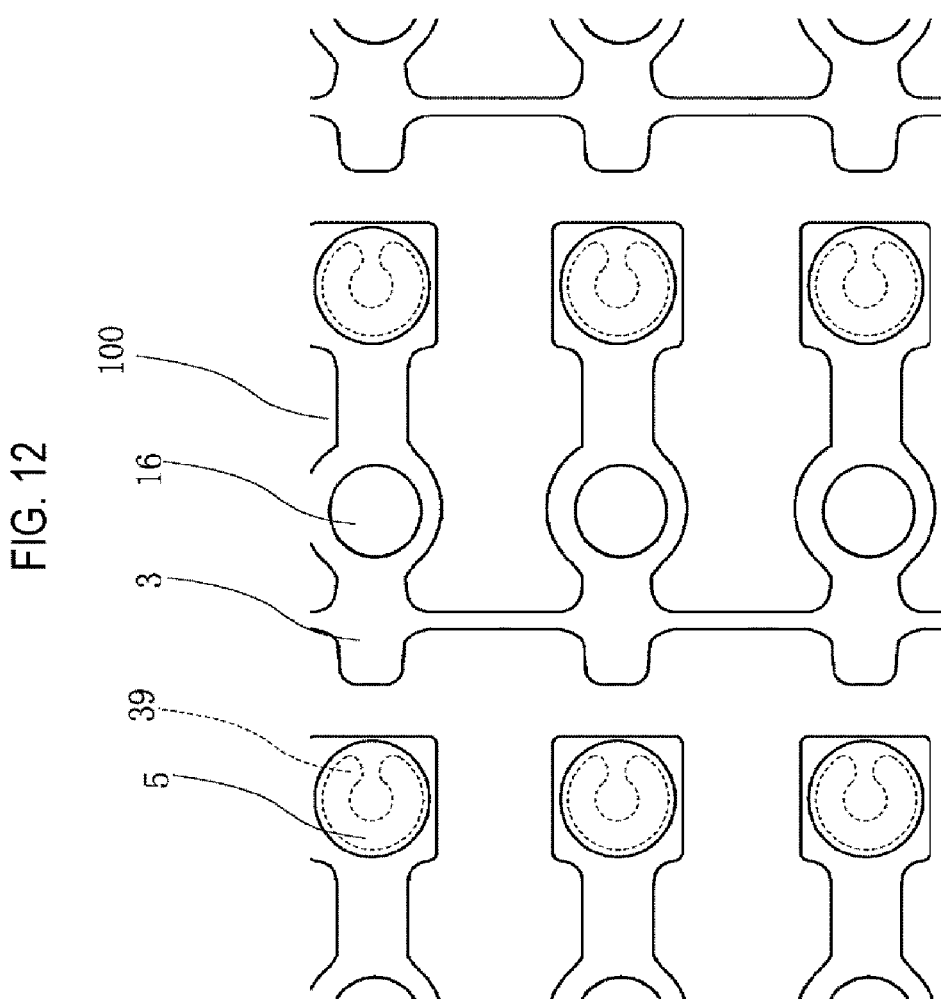
FIG. 12 is a plan view of an electronic device at a certain point of time in the method of manufacturing the electronic device according to the first embodiment.

Next, as shown in FIG. 12, the bonding layer 5 is formed on the wiring pattern 3. A portion of the bonding layer 5 is filled in the opening 39 of the wiring pattern 3.

Figure 13:
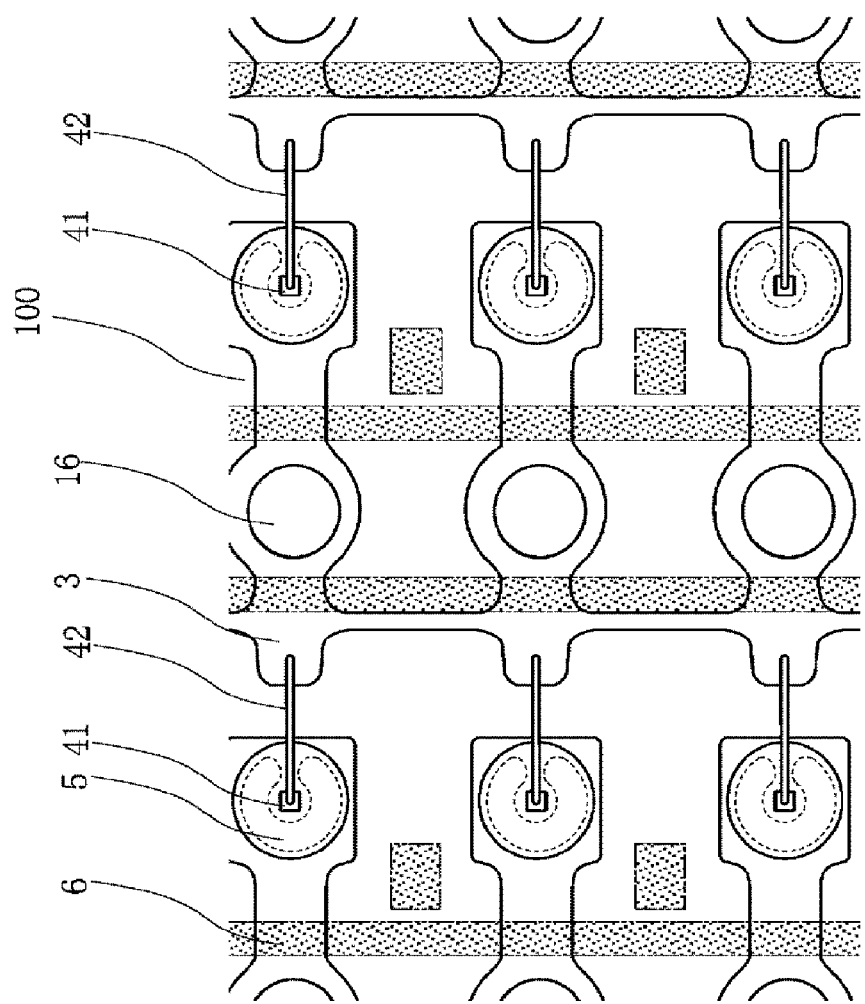
FIG. 13 is a plan view of an electronic device at a certain point of time in the method of manufacturing the electronic device according to the first embodiment.

Next, as shown in FIG. 13, the protective layer 6 is formed on the base 100 with the wiring pattern 3 formed thereon. In the first embodiment, a film-shaped resist is pressed and adhered to the base 100.

Next, as shown in FIG. 13, the electronic element 41 is disposed on the wiring pattern 3 via the bonding layer 5. Next, the wire 42 is wire-bonded to the electronic element 41 and the wiring pattern 3. Thus, the electronic elements 41 and the wiring pattern 3 are electrically interconnected.

Next, although not shown, after the resin portion 7 is formed by molding, a plurality of electronic devices A1 shown in FIG. 1 and so on are produced by dicing an intermediate product on which the resin portion 7 is formed. In the method of manufacturing the electronic device A1, a case of manufacturing a plurality of electronic devices A1 all at once has been illustrated above, but they may be manufactured one by one.

Next, operations and effects of the first embodiment will be described.

In the first embodiment, the opening 39 is formed in the wiring pattern 3. The bonding layer 5 is in contact with the portion 119 of the base 1 exposed by the opening 39 in the wiring pattern 3. With such a configuration, since the bonding strength between the bonding layer 5 and the base 1 is strong, it is possible to prevent the bonding layer 5 from being peeled from the base 1 and the wiring pattern 3.

The bonding strength between the bonding layer 5 and the base 1 is greater than the bonding force between the bonding layer 5 derived from silver paste and the Au plating in the wiring pattern 3. Therefore, in the embodiment in which the bonding layer 5 is derived from silver paste and the wiring pattern 3 includes the Au plating, it is possible to more effectively prevent the bonding layer 5 from being peeled from the base 1 and the wiring pattern 3.

In the case where no filler is mixed in the resin portion 7 as in the first embodiment, the resin portion 7 is likely to absorb water. In this case, water vapor may be accumulated at the interface between the resin portion 7 and the base 1 and at the interface between the resin portion 7 and the wiring pattern 3, possibly causing a water vapor explosion. Even in such a case, in this embodiment, since the bonding layer 5 in contact with the resin portion 7 is firmly bonded to the base 1, it is possible to prevent the bonding layer 5 from being peeled from the wiring pattern 3.

In the first embodiment, the wiring pattern 3 includes the first conductive portion 32. The opening 39 is located between the first conductive portion 32 and the die pad portion 31 when viewed in the thickness direction Z1 of the base 1. With such a configuration, in manufacturing the electronic device A1, a material making up the bonding layer 5 can be stored in the opening 39. Therefore, when the electronic element 41 is disposed on the wiring pattern 3, it is possible to make it easy for the material making the bonding layer 5 to seep up to the electronic element 41. This is suitable to secure electrical conduction between the electronic element 41 and the wiring pattern 3 more favorably when the bonding layer 5 has conductivity. Further, by storing the material making up the bonding layer 5 in the opening 39, it is possible to prevent the material making up the bonding layer 5 from flowing into the wire bonding pad portion 34. As a result, it is possible to prevent defective bonding of the wire 42 to the wire bonding pad portion 34.

In the first embodiment, the front surface 322 of the first conductive portion 32 includes the exposed part 322B exposed from the bonding layer 5. The contact part 322A is located between the exposed part 322B and the opening 39 when viewed in the thickness direction Z1 of the base 1. With such a configuration, when the electronic element 41 is a light emitting element, light from the light emitting element can be reflected by the exposed part 322B. Therefore, when the electronic element 41 is a light emitting element, light from the light emitting element can be emitted outside of the electronic device A1 with higher efficiency.

During a flow of manufacture of the electronic device A1, heat is transferred from the first edge portion 35A side to the first conductive portion 32 via the first connecting portion 36A. In the first embodiment, the second conductive portion 33 is disposed on a side opposite the first edge portion 35A with respect to the die pad portion 31. This makes it possible to minimize the transfer of heat from the first conductive portion 32 to the die pad portion 31 via the second conductive portion 33.

In the electronic device A1, element adhesion strength of a chip mounting portion is strong, but since the outermost surface of a ring-shaped or horn-shaped portion (the first conductive portion 32) located outside a circumference thereof is gold-plated, it is likely to peel from the bonding layer 5. This may make it difficult only for the electronic element 41 to be pulled upward.

Second Embodiment

A second embodiment will be described with reference to FIG. 14.

Figure 14:
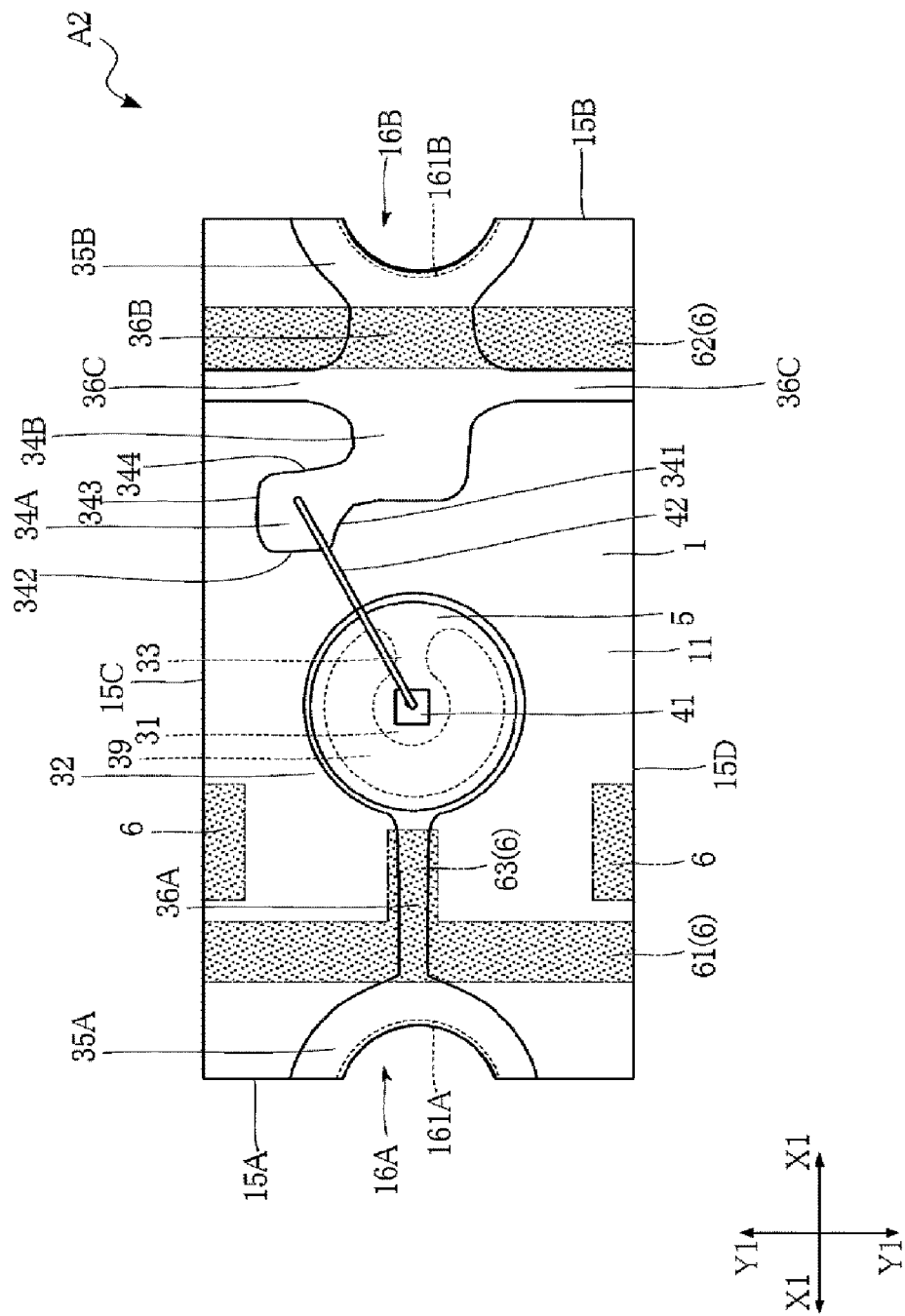
FIG. 14 is a plan view of an electronic device according to a second embodiment.

FIG. 14 is a plan view of an electronic device A2 according to a second embodiment in which a resin portion is excluded from the electronic device.

In the following description, the same or similar elements, portions and parts as above are denoted by the same reference numerals and explanation thereof will not be repeated as appropriate.

In the second embodiment, the outer shape of the first conductive portion 32 and the specific shape of the protective layer 6 are different from those of the electronic device A1. In the second embodiment, the outer shape of the first conductive portion 32 is a circular shape. In addition, the protective layer 6 includes a portion 63 formed on the first connecting portion 36A. The portion 63 extends along the same direction (the first direction X1) as the extending direction of the first connecting portion 36A. The position of a wire bonding pad portion 34A deviates from the position of the wire bonding pad portion 34 of the first embodiment in the second direction Y1. The wire bonding pad portion 34A is connected to a portion 34B. The description of the wire bonding pad portion 34 of the first embodiment may be applied for the portion 34B.

In the second embodiment, the wire bonding pad portion 34A includes edges 341 to 344. The edge 341 is connected to the portion 34B and extends substantially along the first direction X1 (strictly speaking, a direction inclined to the first direction X1). The edge 342 is connected to the edge 341 and extends substantially along the second direction Y1 (strictly speaking, a direction inclined to the second direction Y1). The edge 343 is connected to the edge 342 and extends along the first direction X1. The edge 344 is connected to the edge 343 and extends substantially along the second direction Y1 (strictly speaking, a direction inclined to the second direction Y1). The edge 344 is connected to the portion 34B.

The second embodiment has the following advantages in addition to the advantages described in the first embodiment. During a flow of manufacture of the electronic device A2, heat is transferred from the first edge portion 35A side to the first conductive portion 32 via the first connecting portion 36A. However, since the portion 61 of the protective layer 6 is formed on the first connecting portion 36A, the resin portion 7 is bonded to the portion 61 on the first connecting portion 36A. This makes it possible to prevent the resin portion 7 from being peeled from the wiring pattern 3 on the first connecting portion 36A.

According to the second embodiment, the wire bonding pad portion 34A is disposed at a position deviating from the electronic element 41 in the second direction Y1. Therefore, it is possible to secure a larger distance between two bonding positions of the wire 42 while suppressing an increase in the area of the main surface 11. As a result, it is possible to improve the reliability of the connection of the wire 42 while reducing the area of the main surface 11. As one of the reasons, for example, compared to a case where the wire bonding pad portion 34A is not disposed at a position deviating from the electronic element 41 in the second direction Y1, it is possible to suppress increase in distance in the first direction X1 (this can cause an increase in area of the main surface 11) as much as possible while increasing the distance between the electronic element 41 and the wire bonding pad portion 34A for wire bonding.

According to the second embodiment, a portion of the wire 42 overlaps with the opening 39 when viewed from a top view. This makes it possible to reduce parasitic capacitance that may occur between the wire 42 and the wiring pattern 3. As a result, it is possible to control the electronic element 41 with higher accuracy.

Third Embodiment

Next, a third embodiment will be described with reference to FIG. 15.

Figure 15:
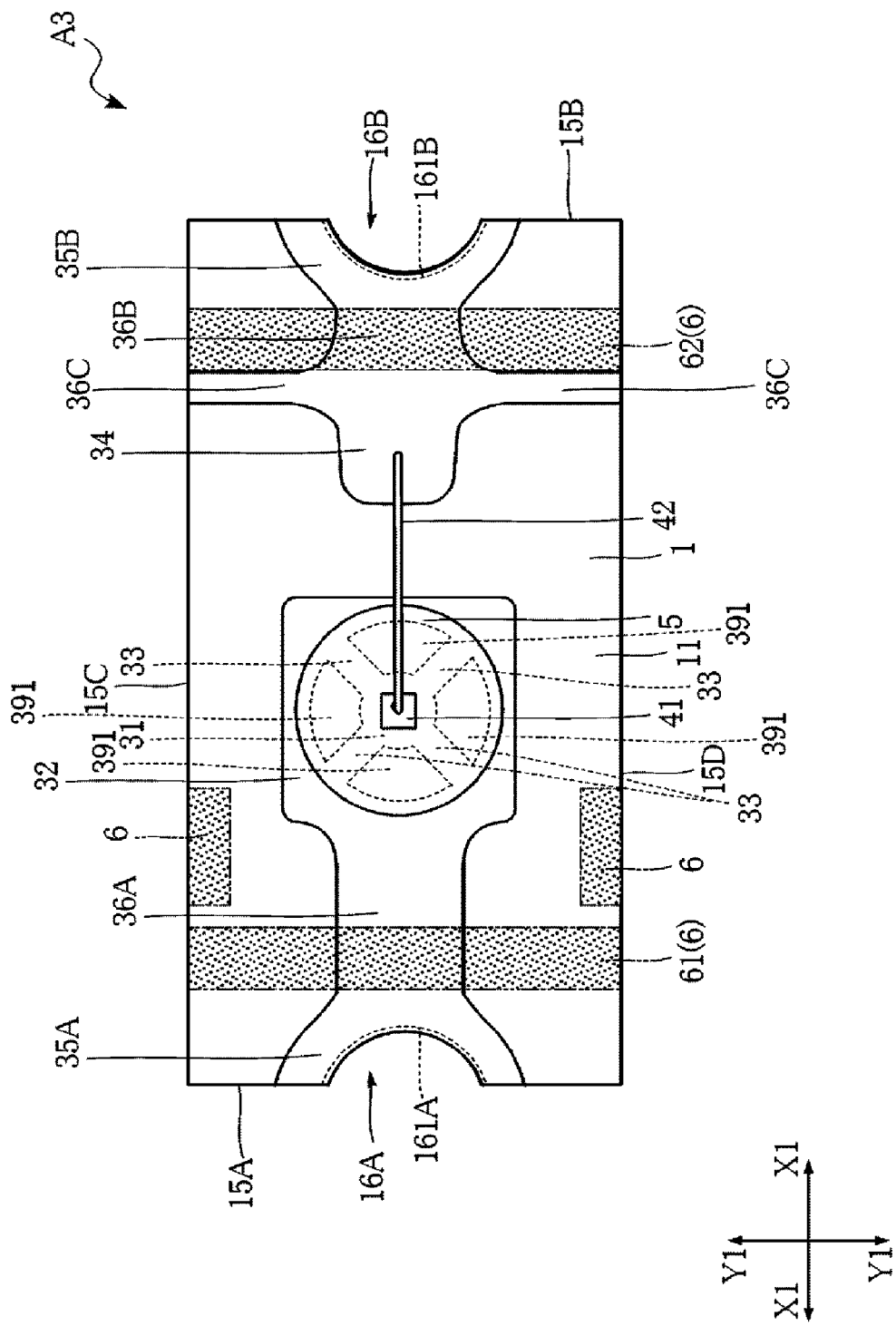
FIG. 15 is a plan view of an electronic device according to a third embodiment.

FIG. 15 is a plan view of an electronic device A3 according to a third embodiment in which a resin portion is excluded from the electronic device.

In the following description, the same or similar elements, portions and parts as above are denoted by the same reference numerals and explanation thereof will not be repeated as appropriate.

The third embodiment is different from the first embodiment in that the wiring pattern 3 includes a plurality of second conductive portions 33. Each of the plurality of second conductive portions 33 radially extends from the die pad portion 31. The opening 39 in the wiring pattern 3 has a plurality of portions 391 separated from each other. The configuration of the third embodiment may be combined with the configuration of the second embodiment.

The third embodiment is particularly suitable, for example, when the size of the electronic element 41 is larger than the size in the first embodiment.

According to the third embodiment, a portion of the wire 42 overlaps with the opening 39 when viewed from a top view. This makes it possible to reduce parasitic capacitance that may occur between the wire 42 and the wiring pattern 3. As a result, it is possible to control the electronic element 41 with higher accuracy.

The present disclosure is not limited to the above-described embodiments. The specific configurations of various portions and parts of the present disclosure can be changed in design in different ways.

Variations of the above-described embodiments will be supplemented as follows.

[Supplementary Note 1]

An electronic device including: a base; a wiring pattern formed on the base; an electronic element disposed on the wiring pattern; and a bonding layer interposed between the electronic element and the wiring pattern, wherein an opening is formed in the wiring pattern and the bonding layer is in contact with a portion of the base exposed by the opening in the wiring pattern.

[Supplementary Note 2]

The electronic device of Supplementary Note 1, wherein the wiring pattern includes a die pad portion on which the electronic element is disposed, a part of the die pad portion defines the opening, and the bonding layer is in contact with the die pad portion.

[Supplementary Note 3]

The electronic device of Supplementary Note 2, wherein the die pad portion includes a first inner side surface facing a direction intersecting a thickness direction of the base, the first inner side surface defines a portion of the opening, and the bonding layer is in contact with the first inner side surface.

[Supplementary Note 4]

The electronic device of Supplementary Note 3, wherein the wiring pattern includes a first conductive portion and the opening is located between the first conductive portion and the die pad portion when viewed in the thickness direction of the base.

[Supplementary Note 5]

The electronic device of Supplementary Note 4, wherein the first conductive portion includes a second inner side surface facing the first inner side surface and the bonding layer is in contact with the second inner side surface.

[Supplementary Note 6]

The electronic device of Supplementary Note 4 or 5, wherein the first conductive portion includes a front surface facing the thickness direction of the base and the front surface of the first conductive portion includes a contact part in contact with the bonding layer.

[Supplementary Note 7]

The electronic device of Supplementary Note 6, wherein the surface of the first conductive portion includes an exposed part exposed from the bonding layer and the contact part is located between the exposed part and the opening when viewed in the thickness direction of the base.

[Supplementary Note 8]

The electronic device of any one of Supplementary Notes 4 to 7, wherein the first conductive portion has an annular shape surrounding the die pad portion.

[Supplementary Note 9]

The electronic device of Supplementary Note 4, wherein the wiring pattern includes one or more second conductive portions connected to both the die pad portion and the first conductive portion, each of the one or more second conductive portions is located between the die pad portion and the first conductive portion, a part of one of the one or more second conductive portions defining the opening, and the bonding layer is in contact with the one or more second conductive portions.

[Supplementary Note 10]

The electronic device of Supplementary Note 9, wherein each of the one or more second conductive portions extends from the die pad portion toward the first conductive portion when viewed in the thickness direction of the base and has a front surface facing the thickness direction of the base, and the front surface of each of the one or more second conductive portions is in contact with the bonding layer.

[Supplementary Note 11]

The electronic device of Supplementary Note 10, wherein the die pad portion includes a first edge and a second edge located on opposite sides in the die pad portion when viewed in the thickness direction of the base, and a width of each of the one or more second conductive portions is smaller than a separation distance between the first edge and the second edge.

[Supplementary Note 12]

The electronic device of any one of Supplementary Notes 1 to 11, wherein the electronic element is an optical element or a zener diode.

[Supplementary Note 13]

The electronic device of Supplementary Note 4, further including a wire bonded to the electronic element, wherein the wiring pattern includes a wire bonding pad portion to which the wire is bonded.

[Supplementary Note 14]

The electronic device of Supplementary Note 13, wherein the base has a main surface and a back surface opposing each other, the electronic element is disposed on the main surface, and the wiring pattern is formed on the main surface and the back surface.

[Supplementary Note 15]

The electronic device of Supplementary Note 14, wherein the base has a first side surface and a second side surface facing a direction perpendicular to the thickness direction of the base, the first side surface and the second side surface opposing each other, wherein a first concave portion recessed from the first side surface and a second concave portion recessed from the second side surface are formed in the base, wherein the wiring pattern includes a first connecting portion, a second connecting portion, a first edge portion, a second edge portion, a first side surface portion, and a second side surface portion, wherein the first edge portion is formed on the main surface and extends along an edge of the first concave portion, wherein the second edge portion is formed on the main surface and extends along an edge of the second concave portion, wherein the first side surface portion is formed on an inner side surface of the first concave portion and is connected to the first edge portion, wherein the second side surface portion is formed on an inner side surface of the second concave portion and is connected to the second edge portion, wherein the first connecting portion is formed on the main surface, is located between the first conductive portion and the first edge portion, and is electrically connected to the first conductive portion and the first edge portion, and wherein the second connecting portion is formed on the main surface, is located between the wire bonding pad portion and the second edge portion, and is electrically connected to the wire bonding pad portion and the second edge portion.

[Supplementary Note 16]

The electronic device of any one of Supplementary Notes 1 to 15, further including a resin portion covering the electronic element, the wiring pattern, and the base.

[Supplementary Note 17]

The electronic device of Supplementary Note 15, further including a protective layer covering the wiring pattern, wherein the protective layer includes a portion covering the first connecting portion.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An electronic device comprising:
    a base having a first surface;
    a wiring pattern formed on the first surface of the base;
    an electronic element disposed on the wiring pattern; and
    a bonding layer interposed between the electronic element and the wiring pattern,
    wherein an opening is formed in the wiring pattern, and the bonding layer is in contact with a portion of the base exposed by the opening in the wiring pattern, and
    wherein the opening is spaced apart from the electronic element when viewed in a first direction perpendicular to the first surface of the base such that the opening and the electronic element do not overlap.

2. The electronic device of claim 1, wherein the wiring pattern includes a die pad portion on which the electronic element is disposed, a part of the die pad portion defines the opening, and the bonding layer is in contact with the die pad portion.

3. The electronic device of claim 2, wherein the die pad portion includes a first inner side surface facing a direction intersecting the first direction, the first inner side surface defines a portion of the opening, and the bonding layer is in contact with the first inner side surface.

4. The electronic device of claim 3, wherein the wiring pattern includes a first conductive portion and the opening is located between the first conductive portion and the die pad portion when viewed in the first direction.

5. The electronic device of claim 4, wherein the first conductive portion includes a second inner side surface facing the first inner side surface and the bonding layer is in contact with the second inner side surface.

6. The electronic device of claim 4, wherein the first conductive portion includes a front surface facing the first direction and the front surface of the first conductive portion includes a contact part in contact with the bonding layer.

7. The electronic device of claim 6, wherein the front surface of the first conductive portion includes an exposed part exposed from the bonding layer and the contact part is located between the exposed part and the opening when viewed in the first direction.

8. The electronic device of claim 4, wherein the first conductive portion has an annular shape surrounding the die pad portion.

9. The electronic device of claim 4, wherein the wiring pattern includes one or more second conductive portions connected to both the die pad portion and the first conductive portion, each of the one or more second conductive portions is located between the die pad portion and the first conductive portion, a part of one of the one or more second conductive portions defines the opening, and the bonding layer is in contact with the one or more second conductive portions.

10. The electronic device of claim 9, wherein each of the one or more second conductive portions extends from the die pad portion toward the first conductive portion when viewed in the first direction and has a front surface facing the first direction, and the front surface of each of the one or more second conductive portions is in contact with the bonding layer.

11. The electronic device of claim 10, wherein the die pad portion includes a first edge and a second edge located on opposite sides of the die pad portion when viewed in the first direction, and a width of each of the one or more second conductive portions is smaller than a separation distance between the first edge and the second edge.

12. The electronic device of claim 1, wherein the electronic element is an optical element or a zener diode.

13. The electronic device of claim 4, further comprising a wire bonded to the electronic element, wherein the wiring pattern includes a wire bonding pad portion to which the wire is bonded.

14. The electronic device of claim 13, wherein the base further has a second surface, the first surface and the second surface face opposite directions to each other, the electronic element is disposed on the first surface, and the wiring pattern is formed on the first surface and the second surface.

15. The electronic device of claim 14, wherein the base has a first side surface and a second side surface facing a direction perpendicular to the first direction, the first side surface and the second side surface facing opposite directions,
    wherein a first concave portion recessed from the first side surface and a second concave portion recessed from the second side surface are formed in the base,
    wherein the wiring pattern includes a first connecting portion, a second connecting portion, a first edge portion, a second edge portion, a first side surface portion, and a second side surface portion,
    wherein the first edge portion is formed on the first surface and extends along an edge of the first concave portion,
    wherein the second edge portion is formed on the first surface and extends along an edge of the second concave portion,
    wherein the first side surface portion is formed on an inner side surface of the first concave portion and is connected to the first edge portion,
    wherein the second side surface portion is formed on an inner side surface of the second concave portion and is connected to the second edge portion,
    wherein the first connecting portion is formed on the first surface, is located between the first conductive portion and the first edge portion, and is electrically connected to the first conductive portion and the first edge portion, and
    wherein the second connecting portion is formed on the first surface, is located between the wire bonding pad portion and the second edge portion, and is electrically connected to the wire bonding pad portion and the second edge portion.

16. The electronic device of claim 1, further comprising a resin portion covering the electronic element, the wiring pattern, and the base.

17. The electronic device of claim 15, further comprising a protective layer covering the wiring pattern, wherein the protective layer includes a portion covering the first connecting portion.

18. The electronic device of claim 1, wherein the opening is defined as one or more portions of an annular shape.

19. The electronic device of claim 14, wherein a height of the bonding layer from the first surface is greater than a height of the die pad portion from the first surface.

20. The electronic device of claim 15, wherein the first concave portion and the second concave portion have a semicircular shape when viewed in the first direction.

21. The electronic device of claim 1, wherein the opening includes a plurality of portions separated from each other, each portion being a part of an annular shape.

22. The electronic device of claim 1, wherein a part of the bonding layer is filled in the opening.

23. The electronic device of claim 1, wherein the opening at least partially surrounds the electronic element when viewed in the first direction.

24. The electronic device of claim 1, wherein the opening includes a curved side.

25. The electronic device of claim 21, wherein the plurality of portions of the opening are formed in a circumferential direction to surround the electronic element while not overlapping with the electronic element when viewed in the first direction.

\* \* \* \* \*